(12) United States Patent
Ninomiya

(10) Patent No.: US 6,489,176 B2
(45) Date of Patent: Dec. 3, 2002

(54) METHOD OF MANUFACTURING ARRAY SUBSTRATE FOR DISPLAY DEVICE AND METHOD OF MANUFACTURING DISPLAY DEVICE

(75) Inventor: Toshihiro Ninomiya, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/814,962

(22) Filed: Mar. 23, 2001

(65) Prior Publication Data

US 2001/0029055 A1 Oct. 11, 2001

(30) Foreign Application Priority Data

Mar. 24, 2000 (JP) ........................................ 2000-085103

(51) Int. Cl.$^7$ .............................................. H01L 21/00
(52) U.S. Cl. ....................... 438/30; 438/942; 438/149
(58) Field of Search ................. 438/28–30, 149–152, 438/942–946

(56) References Cited

U.S. PATENT DOCUMENTS 6,406,949 B1 * 6/2002 Kim ............................ 438/158
6,407,780 B1 * 6/2002 Sung ........................... 349/43

FOREIGN PATENT DOCUMENTS

JP          10-312957         11/1998

* cited by examiner

Primary Examiner—Jey Tsai
(74) Attorney, Agent, or Firm—Pillsbury Winthrop LLP

(57) ABSTRACT

In the manufacturing method of an array substrate for a planar display device, a first pattern is formed on a substrate by correcting in advance the size of the first pattern in view of an amount of deformation of the substrate. Then, the next pattern is formed on the substrate in conformity with the pattern formed in the preceding step.

17 Claims, 6 Drawing Sheets

METHOD OF MANUFACTURING ARRAY SUBSTRATE FOR DISPLAY DEVICE AND METHOD OF MANUFACTURING DISPLAY DEVICE

CROSS-REFERENCE TO RELATED APPLICATIONS

This application is based upon and claims the benefit of priority from the prior Japanese Patent Application No. 2000-085103, filed Mar. 24, 2000, the entire contents of which are incorporated herein by reference.

BACKGROUND OF THE INVENTION

The present invention relates to a method of manufacturing an array substrate for display devices such as an active matrix type liquid crystal display device and an organic electroluminescence (EL) display device, particularly, to a method of manufacturing an array substrate using a polycrystalline silicon and a method of manufacturing a display device.

In recent years, a liquid crystal display device is widely used in a notebook type computer or various portable apparatuses because of its big merits such as a high image quality, a thin and lightweight structure, and a low power consumption. In this connection, keen attentions are paid to a further improvement in the performance and the manufacturing technology of the liquid crystal display device. Particularly, an active matrix type liquid crystal display device, in which a switching element such as a thin film transistor (TFT) is connected to each display pixel, attracts attentions because a large display screen can be obtained easily and the particular liquid crystal display device can be manufactured by the conventional semiconductor manufacturing technology. Also, the research and development of a TFT used in an array substrate of a liquid crystal display device are being made vigorously. Recently, a TFT using a polycrystalline silicon having a high field-effect mobility is being studied vigorously.

The array substrate of a liquid crystal display device equipped with such TFTs is manufactured as follows. In the first step, a semiconductor layer consisting of a polycrystalline silicon is formed on an insulating substrate such as a glass substrate. Then, a gate insulating film is formed in a manner to cover the semiconductor layer, followed by forming a first wiring layer (gate electrodes and gate wirings integral with the gate electrodes) on the gate insulating film.

In the next step, source regions and drain regions are formed by doping a large amount of phosphorus, boron or the like in the semiconductor layer by an ion implantation method, by using the first wiring layer itself or the resist film, used in forming the first wiring layer, as a mask.

Since the dopant as doped is not activated, a heat treatment is applied after the doping step so as to activate the dopant, thereby ensuring a desired low resistivity. The heat treatment is carried out at high temperatures, i.e., at 500 to 600° C.

After the heat treatment, an interlayer insulating film is formed in a manner to cover the gate electrodes and the gate insulating film, followed by forming a contact hole in each regions of the gate insulating film and the interlayer insulating film which are positioned above the source regions and the drain regions.

Further, source electrodes and drain electrodes are formed as a second wiring layer on the interlayer insulating film. the source electrode is connected to each source region via the contact hole, and the drain electrode is connected to each drain region via the contact hole. Also, pixel electrodes are formed in parts on the interlayer insulating film except the TFT forming regions and connected to the respective source electrodes. Finally, a protective film is formed on the entire surface of the substrate, thereby preparing a desired TFT array substrate.

In the TFT described above, the semiconductor layer is formed of polycrystalline silicon and, thus, exhibits a high field-effect mobility, making it possible to enhance the driving capability of the liquid crystal and to miniaturize the individual TFT. As a result, where a liquid crystal display device is prepared by using the TFT array substrate described above, the aperture rate is improved so as to improve the brightness of the displayed image or to lower the power consumption.

Also, in the case of using a polycrystalline silicon, it is possible to obtain a high field-effect mobility, making it possible to form integrally a circuit such as a shift register for controlling the operation of the TFTs on the glass substrate by utilizing the foregoing semiconductor layer. In this case, it is unnecessary to provide separately an integrated circuit for driving the TFTs, and the external circuit can be simplified, with the result that it is possible to decrease the number of manufacturing steps of the entire liquid crystal display device and to lower the manufacturing cost.

However, in the manufacturing process of a polycrystalline silicon TFT array, the heat treatment is carried out at temperatures higher than that in the manufacturing process of an amorphous silicon TFT array in many cases. Particularly, the heat treatment after the impurity doping step is carried out at a high temperature in manufacturing a polycrystalline silicon TFT array, with the result that the glass substrate is thermally expanded or thermally shrunk greatly.

Under the circumstances, a glass substrate as used in an amorphous silicon TFT array substrate cannot be used in a polycrystalline silicon TFT array substrate, making it unavoidable to use an exclusive glass substrate having a higher durability in a polycrystalline silicon TFT array substrate.

However, even in the case of using the exclusive glass substrate in a polycrystalline silicon TFT array substrate, it is impossible to avoid the thermal expansion or thermal shrinkage of the glass substrate. Therefore, the finally prepared array substrate is expanded or shrunk relative to a counter substrate, though it is certainly possible to automatically correct the relative positional relationship among the light-exposed patterns by a light exposure machine in each photo engraving process (PEP) in which the light exposure, the development and the etching are carried out by using a photolithography, giving rise to the problem that it is difficult to assemble the array substrate accurately relative to the counter substrate.

It should also be noted that, in a PEP in which the automatic correction cannot be achieved by a light exposure machine, e.g., a collective light exposure step using a large mask, the patterning is performed without taking the expansion or shrinkage of the substrate into consideration, with the result that the formed pattern is deviated from the pattern formed in advance. Particularly, where contact holes are included in the pattern, the contact holes are deviated from desired positions, giving rise to a poor connection of the source electrodes, the drain electrodes, etc. and, thus, to a defective display such as a point defect.

BRIEF SUMMARY OF THE INVENTION

The present invention has been contrived in consideration of the above circumstances and its object is to provide a method of manufacturing an array substrate and a method of manufacturing a display device, having a suppressed defective display such as a point defect and a high reliability while preventing the deviation of patterning due to deformation of the substrate.

According to an aspect of the present invention, there is provided a method of manufacturing an array substrate for a planar display device, including a plurality of first wiring layers and a plurality of second wiring layers formed on a substrate and a plurality of pixels connected to the first and second wiring layers via thin film transistors, wherein each of the thin film transistors includes a semiconductor layer formed of polycrystalline silicon and a gate electrode formed on the semiconductor layer with a gate insulating film interposed therebetween, the method comprising:

a first pattern forming step of forming a first pattern on the substrate by correcting in advance the size of the first pattern in view of the amount of deformation of the substrate; and a second pattern forming step of forming a second pattern on the substrate in conformity with the first pattern by a collective process.

According to the manufacturing method of the present invention defined as above, the pattern is corrected in the first pattern forming step in anticipation of the amount of deformation of the substrate taking place in a step such as a heat treating step, e.g., making it possible to form finally a pattern of a predetermined shape even if the substrate is deformed during the manufacturing steps. It follows that it is possible to prevent the occurrence of a defective display, making it possible to manufacture an array substrate of a high reliability with a high yield.

According to another aspect of the present invention, there is provided a method of manufacturing a display device including a plurality of pixels arranged in a matrix manner, each of the pixels having a first electrode provided on a substrate, a second electrode opposing the first electrode, and a light modulating layer provided between the first and second electrodes, the method comprising:

a first pattern forming step of forming a first pattern on the substrate by correcting in advance the size of the first pattern in view of an amount of deformation of the substrate; and a second pattern forming step of forming a second pattern on the substrate in conformity with the first pattern by a collective process.

According to the method of the present invention for manufacturing a display device defined as above, the pattern is corrected in the first pattern forming step in anticipation of the amount of deformation of the substrate, making it possible to form finally a pattern of a predetermined shape even if the substrate is deformed in the manufacturing steps. It follows that it is possible to prevent the occurrence of a defective display, making it possible to manufacture an array substrate of a high reliability with a high yield. In addition, since the display device is assembled by using the array substrate defined in the present invention, a display device having a high assembling accuracy can be manufactured easily.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention, and together with the general description given above and the detailed description of the preferred embodiments given below, serve to explain the principles of the present invention.

FIGS. 4 to 9 collectively show a manufacturing method according to a third embodiment of the present invention, in which:

FIG. 4 is a cross sectional view showing the step of forming a semiconductor layer, FIG. 5 is a cross sectional view showing the step of forming a gate insulating film and a gate electrode and also showing the ion doping step, FIG. 6 is a cross sectional view showing the step of forming an interlayer insulating film and a contact hole, FIG. 7 is a cross sectional view showing the step of forming an electrode and a protective film, FIG. 8 is a cross sectional view showing the light-exposure step of the contact hole and also showing the etching step, and FIG. 9 is a cross sectional view showing the step of forming a pixel electrode;

FIGS. 10 to 13 collectively show a manufacturing method of an organic EL display device according to a fourth embodiment of the present invention, in which:

FIG. 10 is a cross sectional view showing the organic EL display device,

FIG. 13 is a cross sectional view showing the step of forming a cathode electrode and a cover metal.

DETAILED DESCRIPTION OF THE INVENTION

The manufacturing method of a polycrystalline silicon TFT array substrate according to one embodiment of the present invention will now be described in detail with reference to the accompanying drawings.

The construction of a polycrystalline silicon TFT array substrate manufactured by the method of this embodiment will be described first together with the manufacturing method thereof.

Figure 1:
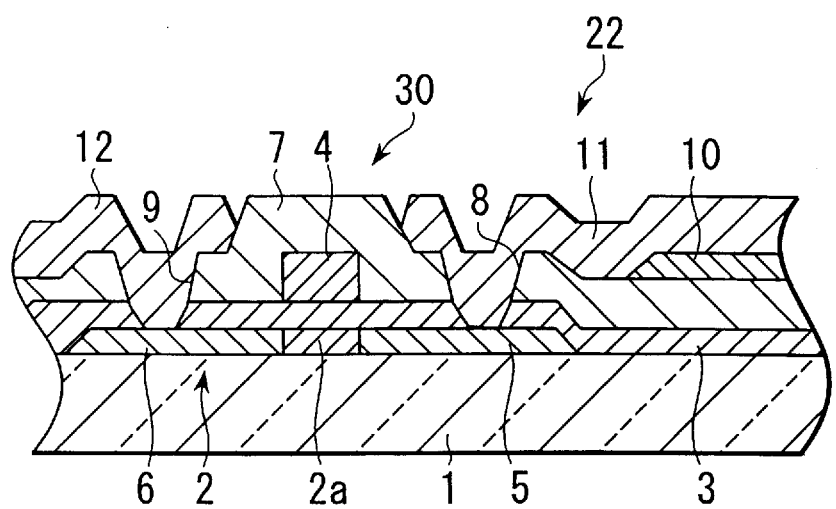
FIG. 1 is a cross sectional view showing a TFT array substrate manufactured by a manufacturing method according to a first embodiment of the present invention.

In the first step, a amorphous silicon film is formed in a thickness of 30 nm to 60 nm by, for example, a plasma CVD (Chemical Vapor Deposition) method on a transparent rectangular glass substrate 1 used as an insulating substrate, as shown in FIG. 1. Where the glass substrate is sized at, for example, 400×500 mm with thickness of 50 nm, and has a glass strain temperature of 667° C. Then, the amorphous silicon film is converted into a polycrystalline silicon film by, for example, an excimer laser annealing method, followed by etching the polycrystalline silicon film by PEP so as to form island-like semiconductor layers 2. Further, a gate insulating film 3 consisting of, for example, a silicon oxide film is formed by a plasma CVD method in a thickness of about 40 nm.

In the next step, a MoW alloy layer is formed on the glass substrate 1 by a sputtering method, followed by forming a resist layer and etching the MoW alloy layer by PEP. Then, the resist layer is peeled off so as to form a gate electrode 4 positioned above a central portion of each semiconductor layer 2 and gate wirings 34 (see FIG. 2) integral with the gate electrodes 4. Incidentally, the gate electrodes 4 and the gate wirings 34 perform the function of a first wiring layer.

Then, a source region 5 and a drain region 6 are formed by doping a high concentration of, for example, boron in each semiconductor layer 2 with the gate electrode 4 used as a mask. The doping is performed by, for example, an ion implantation method. It is appropriate to perform the doping with the dose of the dopant set at about $1\times10^{15}$ to $5\times10^{16}/cm^2$. As a result, each semiconductor layer 2 is constructed to include the source region 5, the drain region 6 and a channel region 2a positioned between the source region 5 and the drain region 6.

Then, the entire glass substrate 1 having various films formed thereon is subjected to a heat treatment at 450 to 650° C., where, for example, 600° C., so as to activate the dopant and, thus, to form the source region 5 and the drain region 6 each having a low resistivity. It is desirable that the heat treatment temperature is set at 65 to 95% of the glass strain temperature, particularly, at 70 to 90% thereof.

After the heat treatment, an interlayer insulating film 7 consisting of, for example, a silicon oxide film is formed in a manner to cover the gate electrodes 4 and the gate insulating film. Then, those portions of the gate insulating film 3 and the interlayer insulating film 7 which are positioned above the source region 5 and the drain region 6 are removed by etching with PEP so as to form contact holes 8 and 9. Also, an Indium Tin Oxide (ITO) film is formed in a thickness of about 40 nm by a sputtering method in a part above the interlayer insulating film 7 except each TFT-forming region, followed by selectively etching the ITO film with PEP so as to form transparent pixel electrodes 10.

Figure 2:
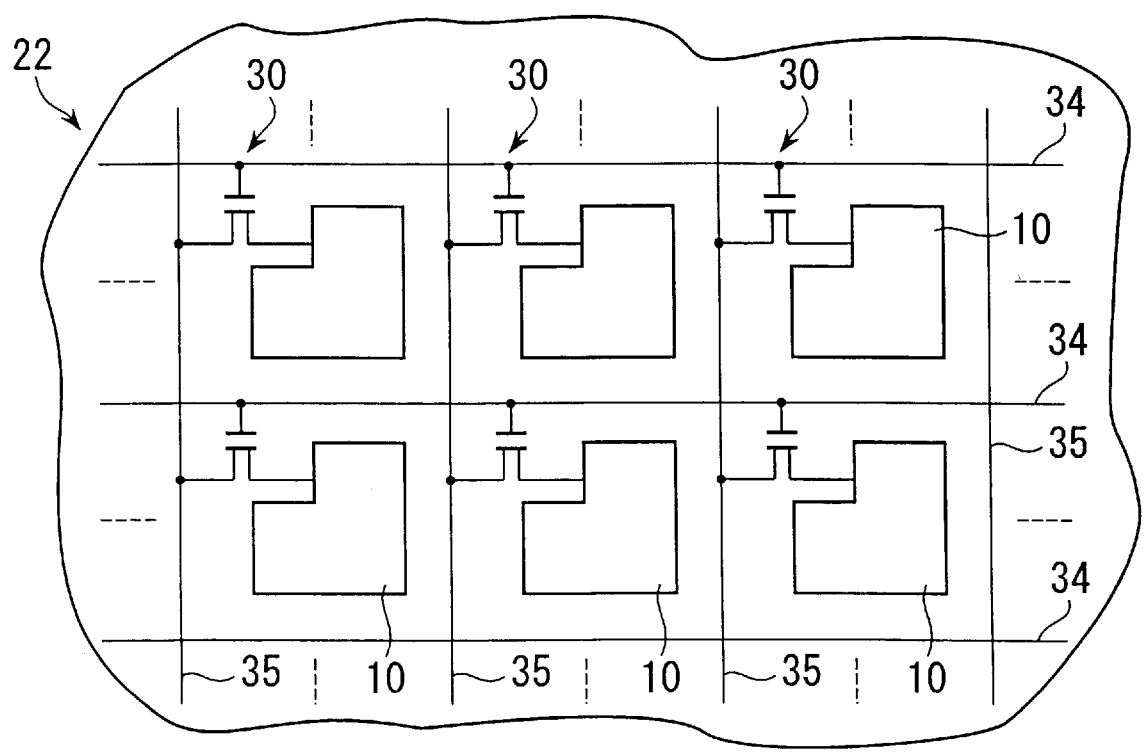
FIG. 2 is a plane view schematically showing the TFT array substrate.

Further, an Al film is formed by a sputtering method in a thickness of about 500 nm on the interlayer insulating film 7, followed by etching the Al film by PEP so as to form a source electrodes 11, a drain electrodes 12 and a signal wiring 35 (see FIG. 2) for each TFT, which collectively form a second wiring layer. In this step, each source electrode 11 is connected to the source region 5 via the contact hole 8 and to the pixel electrode 10. Also, each drain electrode 12 is connected to the drain region 6 via the contact hole 9. Accordingly, as shown in FIG. 2, a TFT array substrate 22 equipped with the pixel electrodes 10, TFTs 30, gate wirings 34, signal wirings 35, etc. is formed on the glass substrate 1.

It is possible to form an insulating film on the entire substrate in order to protect the element portion.

The TFT array substrate 22 thus formed is thermally expanded or shrunk in an anisotropic manner by about 5 to 20 ppm. This implies that, where the glass substrate 1 is sized at, for example, 400×500 mm, the TFT array substrate 22 is thermally expanded or shrunk by 2.5 to 10 $\mu$m in the direction of the longer side. Where the glass substrate is sized at 550×650 mm, the TFT array substrate is thermally expanded or shrunk by 3.25 to 13 $\mu$m. Naturally, each pattern formed on the glass substrate 1 is also subjected similarly to the thermal expansion or shrinkage. As the substrate is heated at a temperature of 50% of the glass strain temperature, thermal expansion of the substrate begins. Thus, during the manufacturing of the TFT array substrate, the glass substrate is thermally deformed. It follows that it is difficult to combine the array substrate 22 with a counter substrate with a high accuracy in the manufacturing process of a liquid crystal display device.

Under the circumstances, according to this embodiment, in the first PEP step included in the manufacturing process of the TFT array substrate, e.g., in an exposure process of the PEP for converting the polycrystalline silicon layer into the island-like semiconductor layers 2, a pattern for exposing the polycrystalline silicon layer is previously shrunk or expanded in an amount (about 5 to 20 ppm) corresponding to the thermal expansion or shrinkage of the glass substrate and is exposed to light on the assumption that the glass substrate 1 is to be thermally expanded or shrunk by about 5 to 20 ppm. For example, where the glass substrate 1 is to be thermally expanded in the heat treating step, the pattern is diminished in advance by about 5 to 20 ppm, which corresponds to the amount of the thermal expansion, and, then, is subjected to the light exposure.

In the photolithography step included in the subsequent PEP, the light exposure machine performs the light exposure of the next pattern while automatically aligning the next pattern with the previous pattern so as to perform a desired patterning. Therefore, if the glass substrate 1 is thermally expanded in the heat treating step, each pattern formed on the glass substrate is also expanded so as to form a pattern as designed. It follows that, when the TFT array substrate is finally prepared, it is possible to obtain a TFT array substrate having patterns formed as designed even if the glass substrate 1 is thermally expanded, compared with the state before the manufacture.

Figure 3:
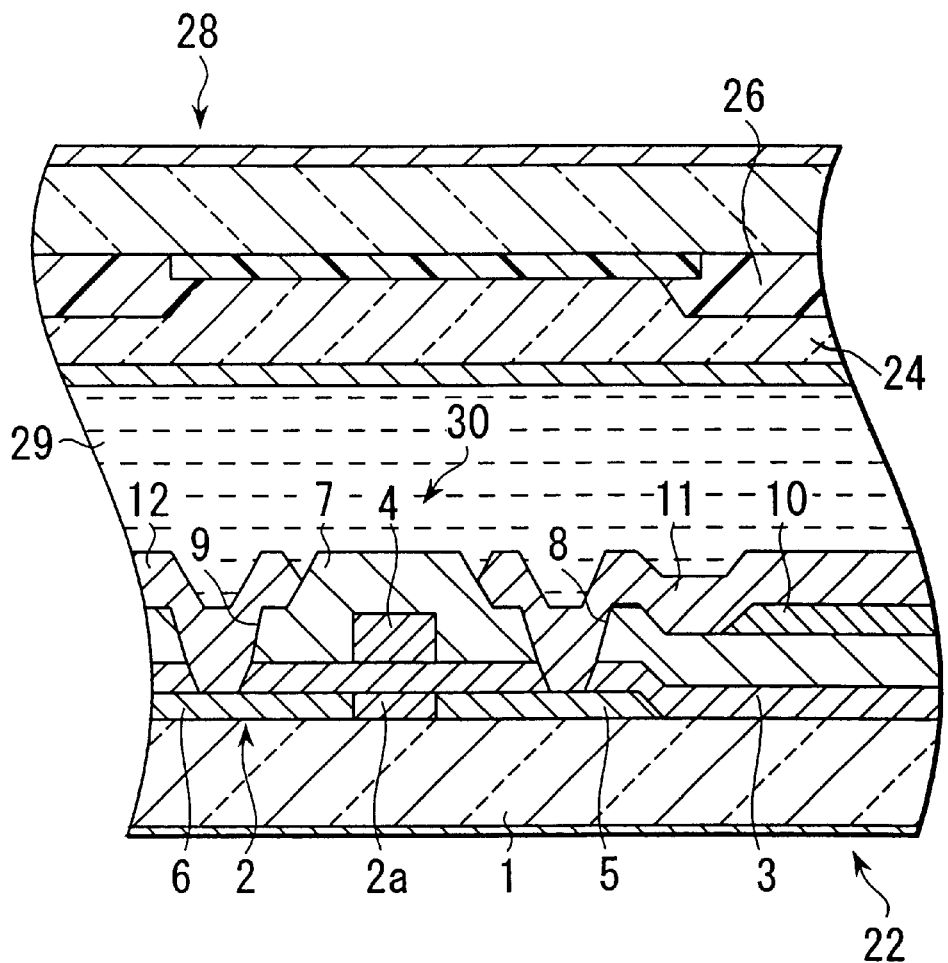
FIG. 3 is a cross sectional view showing a liquid crystal display device manufactured by using the TFT array substrate shown in FIG. 1.

The TFT array substrate 22 thus manufactured is arranged to face a counter substrate 28 equipped with a counter electrode 24, a color filter 26, etc. and the peripheries of these TFT array substrate 22 and counter substrate 28 are bonded to each other, as shown in FIG. 3. Then, liquid crystal molecules 29 serving as a light modulating layer are sealed in the clearance between the TFT array substrate 22 and the counter substrate 28 so as to finish preparation of a liquid crystal display device.

In the assembling step referred to above, the TFT array substrate 22 and the counter substrate 28 can be combined with each other with a high accuracy, the assembling error being suppressed to about 5 $\mu$m or less, so as to make it possible to manufacture a liquid crystal display device with a high accuracy.

A manufacturing method according to a second embodiment of the present invention will now be described.

In the first embodiment described above, the pattern is diminished or magnified in anticipation of about 5 to 20 ppm of the thermal expansion or shrinkage of the glass substrate and subjected to the light exposure in the photolithography step of the first PEP included in the manufacturing process of the TFT array substrate. Alternatively, however, it is also possible to diminish or magnify the pattern in, for example, the photolithography step in the PEP of the MoW alloy layer for forming the gate electrodes 4. It should be noted in this connection that the heat treatment after the impurity doping step is carried out at a high temperature, i.e., at 500 to 600° C., and, thus, the glass substrate 1 is thermally expanded or shrunk greatly in this step. It follows that the effect similar to that obtained in the first embodiment can be obtained by diminishing or magnifying the pattern for the light exposure in anticipation of the thermal expansion or shrinkage of the glass substrate 1 in the PEP step immediately before the heat treating step.

To be more specific, even if the glass substrate 1 is thermally expanded or shrunk at the time when the TFT array substrate 22 is finally prepared, the pattern formed in each step is expanded or shrunk in accordance with the expansion or shrinkage of the glass substrate so as to obtain a pattern as designed. It follows that, in manufacturing a liquid crystal display device, it is possible to combine easily and accurately the TFT array substrate 22 thus prepared with the counter electrode, making it possible to obtain a liquid crystal display device with a high assembling accuracy of about ±5 μm.

The other manufacturing steps of the second embodiment are equal to those the first embodiment and, thus, the description thereof will be omitted.

A manufacturing method according to a third embodiment of the present invention and the construction of the TFT array substrate manufactured by the particular manufacturing method will now be described.

Figure 4:
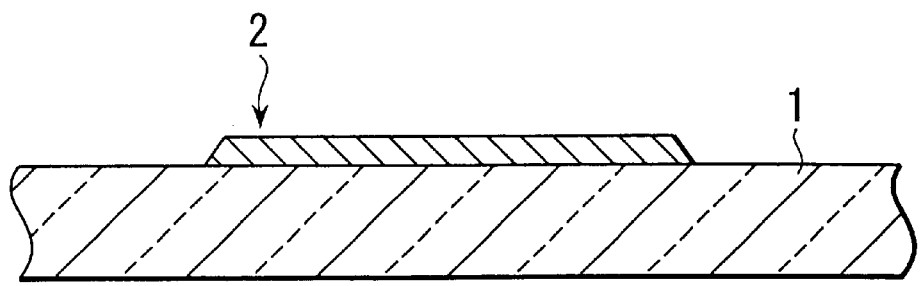

In the first step, an amorphous silicon film is formed by, for example, a plasma CVD method in a thickness of 30 nm to 60 nm, e.g., 50 nm, on a transparent rectangular glass substrate 1 used as an insulating substrate, as shown in FIG. 4. Then, the amorphous silicon film is converted into a polycrystalline silicon film by, for example, an excimer laser annealing method, followed by etching the polycrystalline silicon film by PEP so as to form island-shaped semiconductor layers 2.

Figure 5:
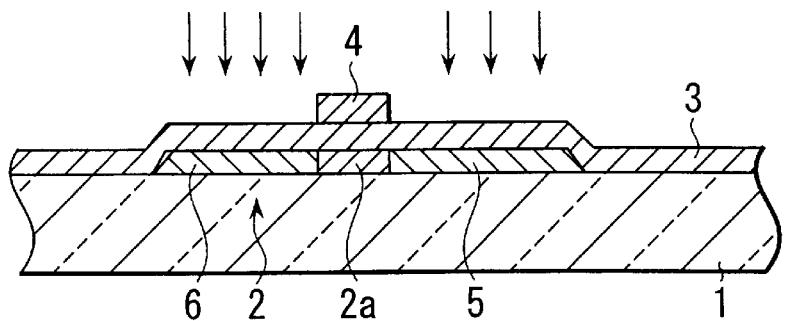

In the next step, a gate insulating film 3 consisting of a silicon oxide film is formed by a plasma CVD method in a manner to cover the semiconductor layers 2, as shown in FIG. 5, followed by forming a MoW alloy layer on the gate insulating film 3 by a sputtering method. After the MoW alloy layer is etched in a predetermined pattern by PEP, a resist layer is peeled off so as to form gate electrodes 4 and gate wirings (not shown) integral with the gate electrodes 4. Incidentally, the gate electrodes 4 and the gate wirings perform the function of a first wiring layer.

In the next step, a source region 5 and a drain region 6 are formed by doping a high concentration of, for example, boron in each semiconductor layer 2, with the gate electrode 4 used as a mask. The doping is performed by, for example, an ion implantation method. It is appropriate to set the dose of the dopant at about $1 \times 10^{15}$ to $5 \times 10^{16}/cm^2$. As a result, each semiconductor layer 2 is constructed to include the source region 5, the drain region 6 and a channel region 21 positioned between the source region 5 and the drain region 6.

Then, the entire glass substrate 1 having various films formed thereon is subjected to a heat treatment at 500 to 600° C. so as to activate the dopant, thereby forming the source region 5 and the drain region 6 each having a low resistivity.

Figure 6:
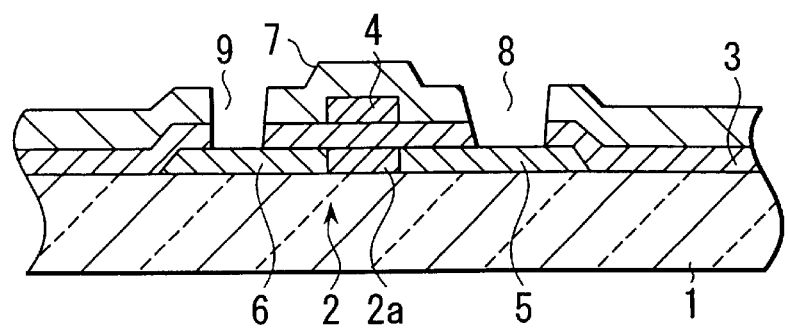

In the next step, an interlayer insulating film 7 consisting of, for example, a silicon oxide film is formed to cover each gate electrode 4 and the gate insulating film 3, as shown in FIG. 6. Further, those portions of the gate insulating film 3 and the interlayer insulating film 7 which are positioned above the source region 5 and the drain region 6 of each semiconductor layer 2 are removed by etching with PEP so as to form contact holes 8 and 9.

Figure 7:
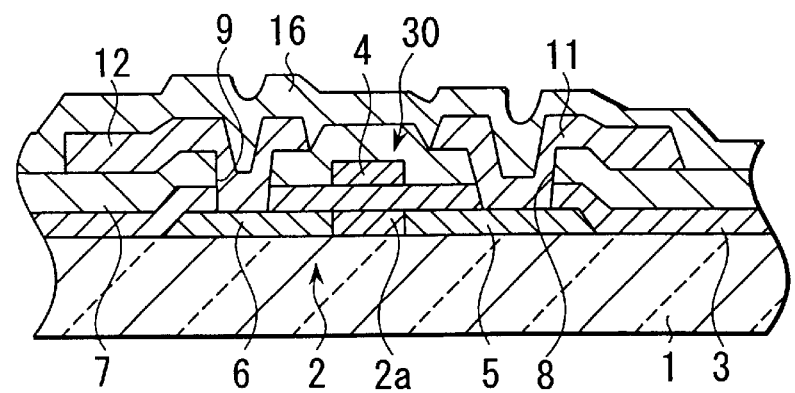

Then an Al film is formed by a sputtering method in a thickness of about 500 nm on the interlayer insulating film 7, as shown in FIG. 7, followed by etching the Al film by PEP so as to form a source electrode 11 and a drain electrode 12 for each TFT, which perform the function of a second wiring layer, as well as signal wirings (not shown). In this step, the source electrode 11 is connected to the source region 5 via the contact hole 8, and the drain electrode 12 is connected to the drain region 6 via the contact hole 9. As a result, a plurality of TFTs 30 are formed on the glass substrate 1. Then, a protective film 16 for protecting the element portion is formed on the entire substrate surface.

Figure 8:
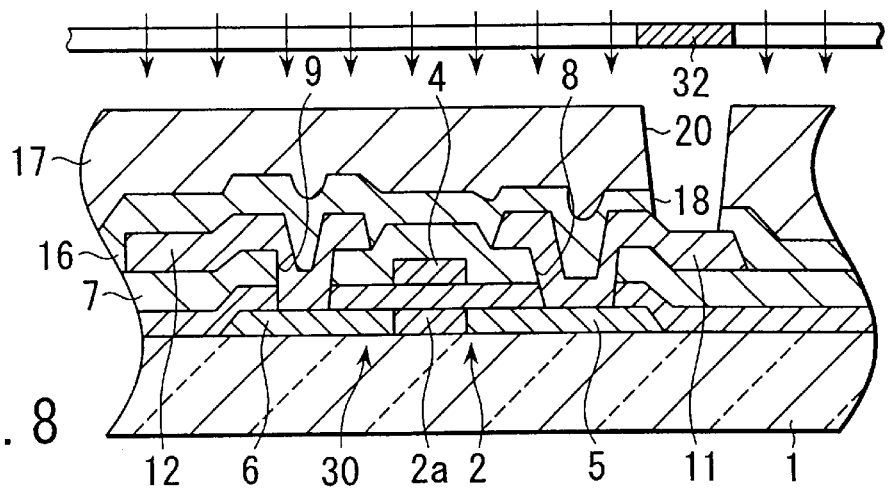

Then, a planarized layer 17 is formed on the entire surface, as shown in FIG. 8, followed by removing by etching the protective film 16 and the planarized layer 17 in the position corresponding to each of the source electrodes 11 so as to form contact holes 18 and 20 communicating with each other. In this step, the protective film 16 and the planarized layer 17 are collectively exposed by a proximity method (referred as a collective process) using a mask 32 formed to have a predetermined pattern. Incidentally, it is possible to form a color filter layer in place of the planarized layer 17.

In the light exposure of the proximity method, the mask and substrate are arranged with a small gap, e.g., 100 nm therebetween, and the layers on the substrate are exposed without interposing an optical system between the substrate and the mask. Thus, the layers on the substrate are exposed with a magnification of 1:1 to the mask.

Figure 9:
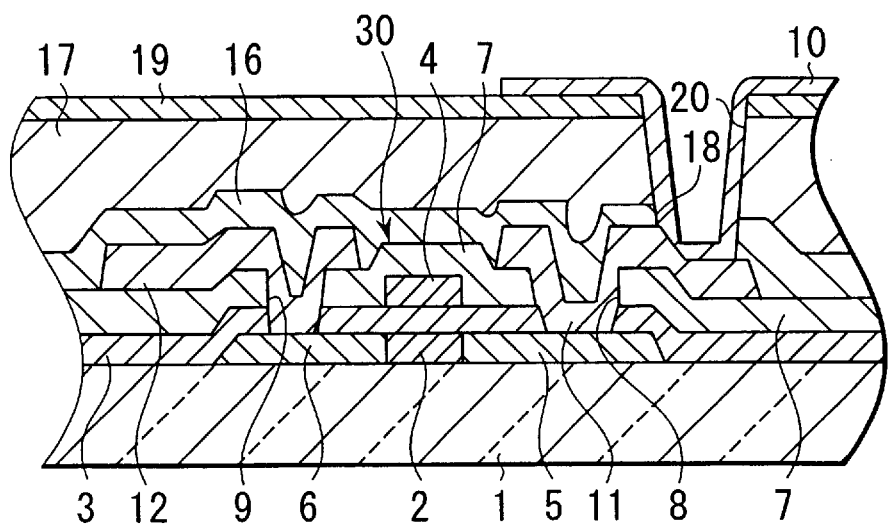

In the next step, an over-coating layer 19 for preventing the contamination is formed on the planarized layer 17, as shown in FIG. 9. Then, pixel electrodes 10 are formed in predetermined positions on the over-coating layer 19 such that each of the pixel. electrodes 10 is connected to the corresponding source electrode 11 via the contact holes 18 and 20, thereby finishing the preparation of a TFT array substrate 22 shown in the drawing.

It should be noted that the TFT array substrate 22 thus prepared is thermally expanded or shrunk by about 5 to 20 ppm at the time of forming the protective film 16. This implies that, where the glass substrate 1 is sized at, for example, 550×650 mm, the glass substrate 1 is thermally expanded or shrunk by 3.25 to 13 μm in the direction of the longer side. Naturally, each of the patterns formed on the glass substrate 1 is also expanded or shrunk.

Also, in the step of forming the contact holes 18 and 20 in the planarized layer 17 and the protective film 16, respectively, the light exposure is collectively performed by the proximity method using a large mask 32 in which it is impossible to correct the amount of the thermal expansion or thermal shrinkage. Therefore, in this case, the pattern of the contact holes 18 and 20 is deviated by 3.25 to 13 μm from the previous pattern that is already formed. It follows that a sufficient contact cannot be achieved between the pixel electrode 10 and the source electrode 11, leading to much occurrence of a defective display such as a point defect and, thus, to a marked reduction of the yield.

Under the circumstances, according to the third embodiment described above, in the first PEP step included in the manufacturing process of the TFT array substrate, e.g., in an exposure process of the PEP for converting the polycrystalline silicon layer into the island-like semiconductor layers 2, a pattern for exposing the polycrystalline silicon layer is previously shrunk or expanded in an amount (about 5 to 20 ppm) corresponding to the thermal expansion or shrinkage of the glass substrate and is exposed to light on the assumption that the glass substrate 1 is to be thermally expanded or shrunk by about 5 to 20 ppm. For example, where the glass substrate 1 is to be thermally expanded in the heat treating step, the pattern is diminished in advance by about 5 to 20 ppm, which corresponds to the amount of the thermal expansion, and, then, is subjected to the light exposure.

In the photolithography step included in the subsequent PEP, the light exposure machine performs the light exposure of the next pattern while automatically aligning the next pattern with the previous pattern so as to perform a desired patterning.

As a result, even if the glass substrate 1 is thermally expanded or shrunk immediately before the step of patterning the contact hole 18 in the planarized layer 17, the pattern formed in each of the previous steps is expanded or shrunk together with the glass substrate so as to form the pattern conforming with the predetermined design value. Therefore, it is possible to form the contact holes 18 and 20 at the predetermined positions even by the collective light exposure of the proximity method using the large mask 32, making it possible to connect the pixel electrode 10 to the source electrode 11 without fail. It follows that it is possible to suppress the defective display such as a point defect and, thus, to manufacture a TFT array substrate of a high reliability with a high yield.

It should also be noted that the TFT array substrate 22 thus manufactured can be combined with the counter electrode easily and accurately as in the first embodiment, making it possible to manufacture a liquid crystal display device of a high accuracy.

In the third embodiment described above, the step of diminishing or magnifying the pattern for the light exposure in an amount corresponding to the thermal expansion or shrinkage of the glass substrate 1 is not limited to the first PEP and can be performed in another PEP. Also, any of the first to third embodiments described above can be applied to the manufacture of a TFT array substrate in which a lightly doped drain region (LDD region) is formed in at least one of the regions between the channel region and the source region and between the channel region and the drain region of the semiconductor layer.

In the above-mentioned embodiment, the collective light exposure is performed by using the proximity method, however it is possible to use a scanning light exposure as a scanning method or a divided light exposure as a step method because these methods have an allowable range, e.g., ±20 ppm, of correcting the magnification.

Further, in the third embodiment, if a color filter layer is formed in place of the planarized layer 17, this color filter layer may be formed by a ink jet process. In the ink jet process, a plurality of ink jet heads are arranged with predetermined intervals and collectively form a plural rows of a color on the array substrate. The ink jet heads repeatedly scan the array substrate by each of colors, thereby forming a color filter layer with red, green, and blue regions.

The color filter can be formed at a predetermined position with a high accuracy without correction in the ink jet process, by diminishing or magnifying the pattern for the light exposure in anticipation of the thermal expansion or shrinkage of the glass substrate 1 in the PEP step before the ink jet process, i.e., the collective process.

A fourth embodiment of the present invention, in which the technical idea of the present invention is applied to the manufacturing method of an organic EL display device, will now be described. First of all, the construction of an organic EL display device will be briefly described with reference to FIG. 10. Particularly, FIG. 10 shows the construction of an organic EL element for one pixel, i.e., the light emitting section.

Figure 10:
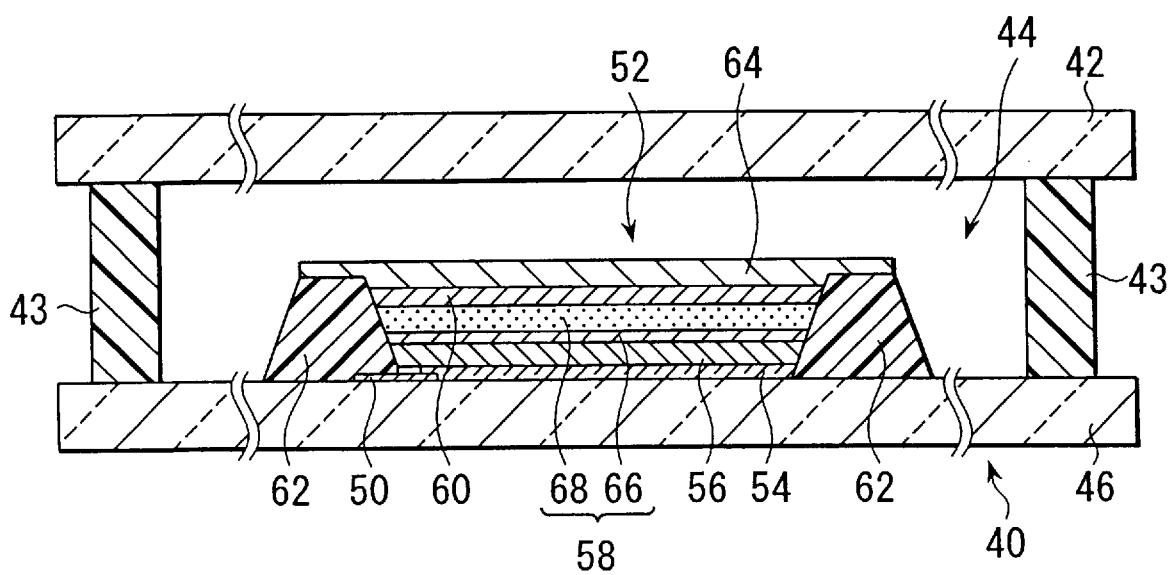

As shown in FIG. 10, the organic EL display device comprises an array substrate 40 and a counter substrate 42 arranged a predetermined apart from and facing the array substrate 40. The peripheries of these array substrate 40 and counter substrate 42 are bonded to each other with a sealing material interposed therebetween such that a hermetic space 44 is defined between these two substrates. The hermetic space 44 is filled with, for example, a nitrogen gas.

The array substrate 40 comprises a transparent glass substrate 46 constituting an insulating substrate. A plurality of TFT's 50 and a plurality of organic EL elements 52 are formed on the glass substrate 46 such that the organic EL elements are connected to the TFT's. As in the embodiments described previously, each TFT 50 comprises a semiconductor layer consisting of a polycrystalline silicon film. On the other hand, each of the organic EL elements 52 comprises an anode electrode 56 in contact with the source region of the TFT 50 through an insulating layer 54, an organic EL layer 58 arranged on the anode electrode 56, a cathode electrode 60 positioned above the anode electrode 56 with the organic EL layer 58 interposed therebetween, and a cover metal layer 64 covering the cathode electrode 60. The organic EL element 52 for one pixel is partitioned by an isolating wall 62 arranged on the glass substrate 46 in a manner to form a lattice structure. The organic EL layer 58 serves as a light modulating layer.

The anode electrode 56 of the organic EL element 52 consists of a transparent electrode formed of, for example, an indium-tin-oxide (ITO) and is arranged on the transparent insulating substrate 54. The organic EL layer 58 is of a laminate structure consisting of a hole-transport layer 66 and a light-emitting layer 68. To be more specific, the hole-transport layer 66, which is arranged on the anode electrode 56, is formed of a thin film of an aromatic amine derivative, a polythiophene derivative, a polyaniline derivative or the like. On the other hand, the light-emitting layer 68, which is arranged on the hole-transport layer 66, is formed of an organic compound emitting a red (R), green (G) or blue (B) light. The light-emitting layer 68 is of a laminate structure including thin films formed of, for example, $Alq_3$ (tris-oxinato complexes of aluminum) or of a laminate structure prepared by laminating PPV (polyparaphenylene vinylene), a polyfluorene derivative or a precursor thereof.

The cathode electrode 60, which is a reflective electrode formed of a material performing an electron injecting function, is laminated on the organic EL layer 58. The cathode electrode 60 is formed by, for example, vapor deposition of barium, calcium or barium-ytterbium. It is possible for the organic EL layer 58 to comprise an electron transfer layer arranged between the light-emitting layer 68 and the cathode electrode 60 in order to improve the electron injection efficiency from the cathode electrode 60. Further, the cover metal layer 64, which is arranged on the cathode electrode 60, is formed by, for example, a vapor deposition of aluminum.

In the organic EL element 52 of the construction described above, electrons and holes are injected into the light-emitting layer 68 held between the anode electrode 56 and the cathode electrode 64, and an exciton is formed by the re-combination of the electron and the hole. A light having a predetermined wavelength is released when the exciton is deactivated, thereby allowing the light-emitting layer 68 to emit light.

The manufacturing method of the organic EL display device of the construction described above will now be described.

Figure 11A:
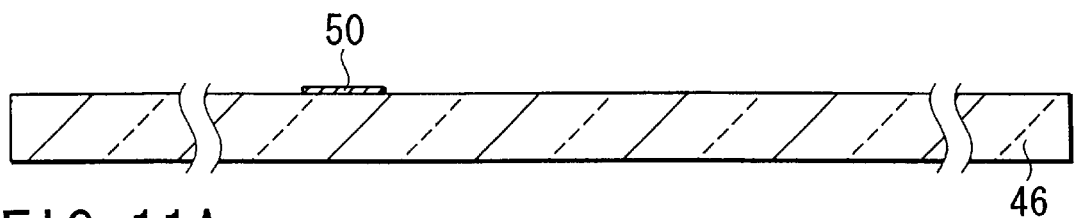
FIGS. 11A to 11D are cross sectional views showing the steps of forming a TFT, an insulating film, an anode electrode and an isolating wall on a glass substrate.

In the first step, a plurality of TFT's 50 are formed within the display area of a glass substrate 46 by forming a semiconductor layer consisting of a polycrystalline silicon, forming an insulating film, forming a metal film, and PEP by the method substantially equal to that employed in the embodiments described previously, as shown in FIG. 11A. At the same time, various electrode wirings (not shown) are formed on the glass substrate 46. As a result, formed are TFT's 50 and the various electrode wirings corresponding to about 920,000 pixels, i.e., 480 (vertical)×640 (lateral)×3 (R, G, B).

Figure 11B:
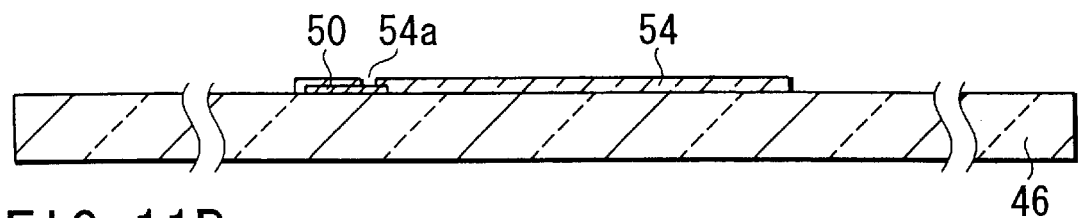
Figure 11C:
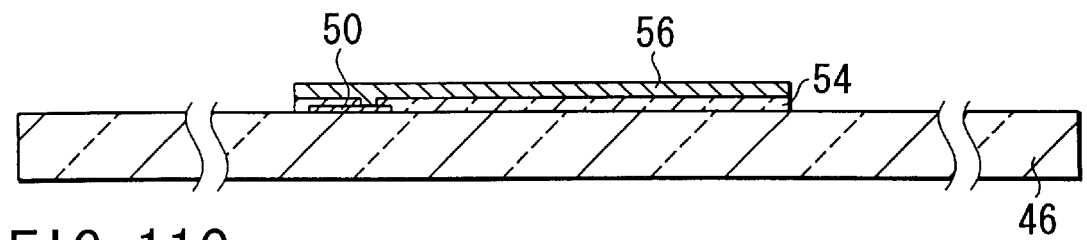
Figure 11D:
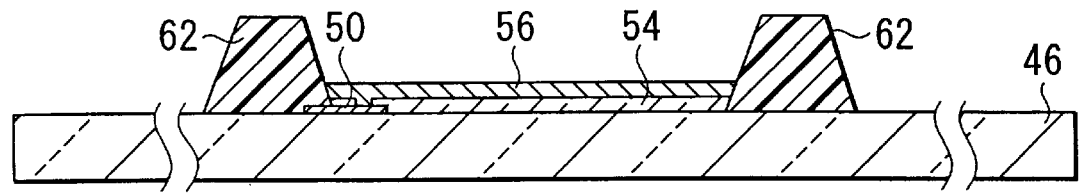

In the next step, a transparent insulating film 54, e.g., a silicon oxide film, is formed by a CVD method on the glass substrate 46, as shown in FIG. 11B. Then, the insulating film 54 is etched by PEP so as to form a contact hole 54a extending to reach the source region of the TFT 50. Further, an anode electrode 56 made of ITO is formed for each pixel, as shown in FIG. 11C. The anode electrode 56 is formed by depositing ITO on the entire substrate surface, followed by patterning the ITO film by PEP. Alternatively, it is possible to form the anode electrode 56 by depositing ITO for each pixel by a mask sputtering method.

In the next step, a grid-like isolating wall 62 is formed to surround each pixel in order to prevent the electric short circuit among the pixels. The isolating wall 62 is formed by arranging first an ultraviolet curing type acrylic resin resist, followed by patterning the resist by a photolithography process and subsequently applying a baking treatment at 220-C for 30 minutes.

Figure 12A:
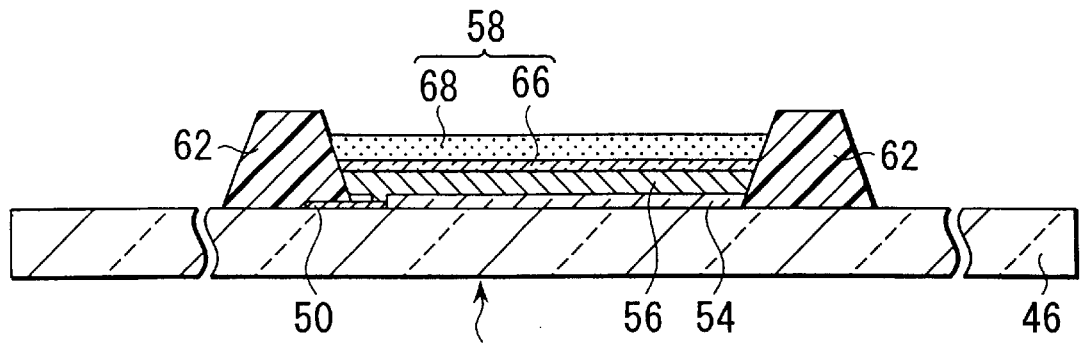
FIG. 12A is a cross sectional view showing the step of forming an organic EL layer.

Then, an organic EL layer 58 is formed on the anode electrode 56 for each pixel, as shown in FIG. 12A. In this embodiment, a hole-transport layer 66 is formed first on the anode electrode 56 for forming the organic EL layer 58. The hole-transport layer 66 is formed by a direct vapor deposition of a low-molecular material such as an aromatic amine derivative on the pixel for each color by using, for example, a striped shadow mask. Then, a light-emitting layer 68 is laminated on the hole-transport layer 66. The light-emitting layer 68 is formed by a direct vapor deposition for each of the light-emitting layers emitting light of red, green and blue by using the same shadow mask.

Figure 12B:
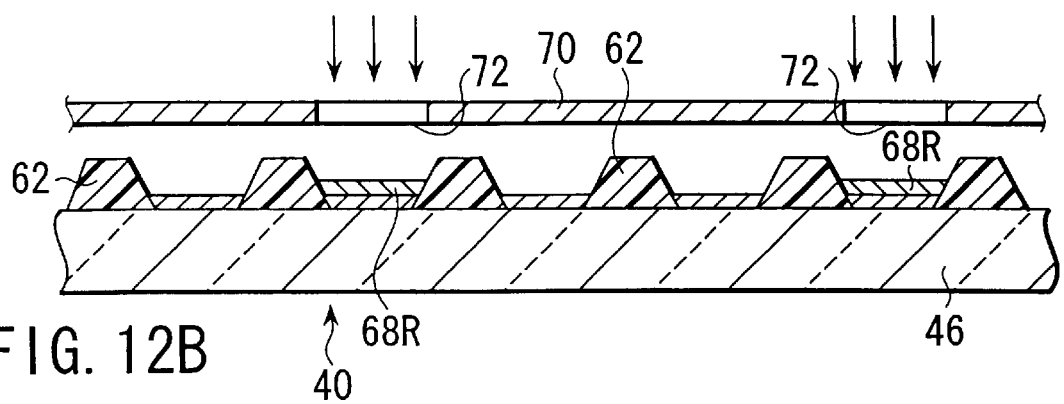
FIGS. 12B to 12D are cross sectional views showing the steps of forming various light-emitting layers by vapor deposition by using a shadow mask.

To be more specific, where the light-emitting layers 68 of three colors (red, green, blue) are formed in the shape of a matrix as shown in FIG. 12B, prepared is a shadow mask 70 having openings 72 for one color alone, each opening 72 being substantially equal in shape to the light-emitting region of each pixel, arranged to form a matrix. Then, the shadow mask 70 is arranged to face the array substrate 40, and the pixels of red (R) are aligned with the openings 72 of the shadow mask 70. Under this condition, the array substrate 40 and the shadow mask 70 are fixed so as to prevent deviation. Further, the system consisting of the array substrate 40 and the shadow mask 70 is arranged within a vacuum chamber. Under this condition, a light-emitting material layer for red is formed on the hole-transport layer 66 of the corresponding pixel by vapor deposition through the shadow mask 70 so as to form a light-emitting layer 68R for red.

Figure 12C:
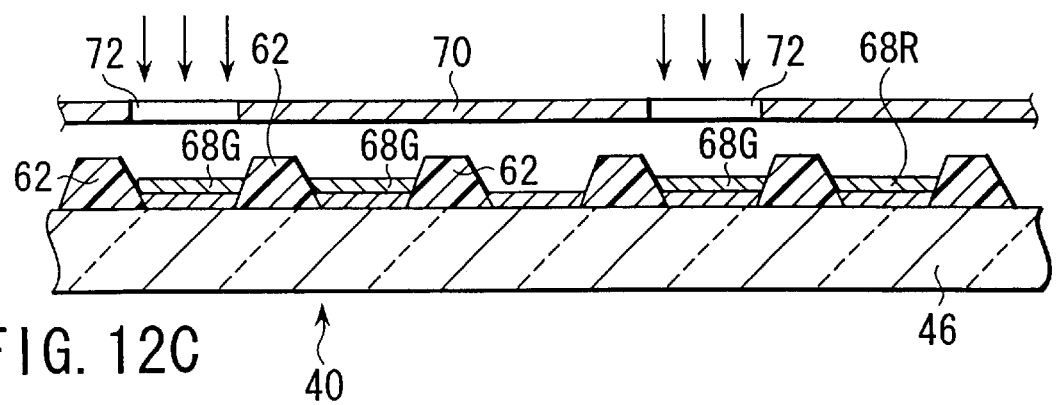

In the next step, the common shadow mask 70 is arranged such that the openings 72 of the mask are aligned with the light-emitting regions of the pixels for green (G) without breaking the vacuum condition, and the array substrate 40 and the shadow mask 70 are fixed so as to prevent the deviation. Under this condition, a light-emitting material layer for green is formed on the hole-transport layer 66 of the corresponding pixel by vapor deposition through the shadow mask 70 so as to form a light-emitting layer 68G for green, as shown in FIG. 12C.

Figure 12D:
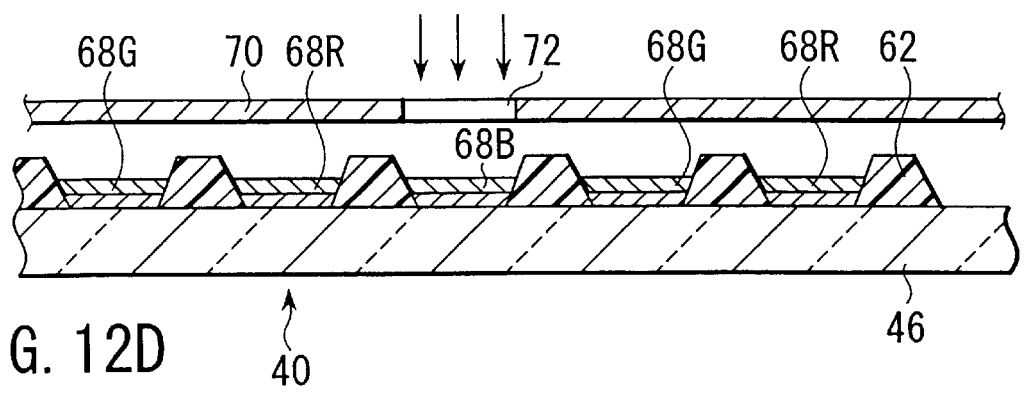

Further, the common shadow mask 70 is arranged such that the openings 72 of the mask are aligned with the light-emitting regions of the pixels for blue (B) without breaking the vacuum condition, and the array substrate 40 and the shadow mask 70 are fixed so as to prevent the deviation. Under this condition, a light-emitting material layer for blue is formed on the hole-transport layer 66 of the corresponding pixel by vapor deposition through the shadow mask 70 so as to form a light-emitting layer 68B for blue, as shown in FIG. 12D.

Figure 13:
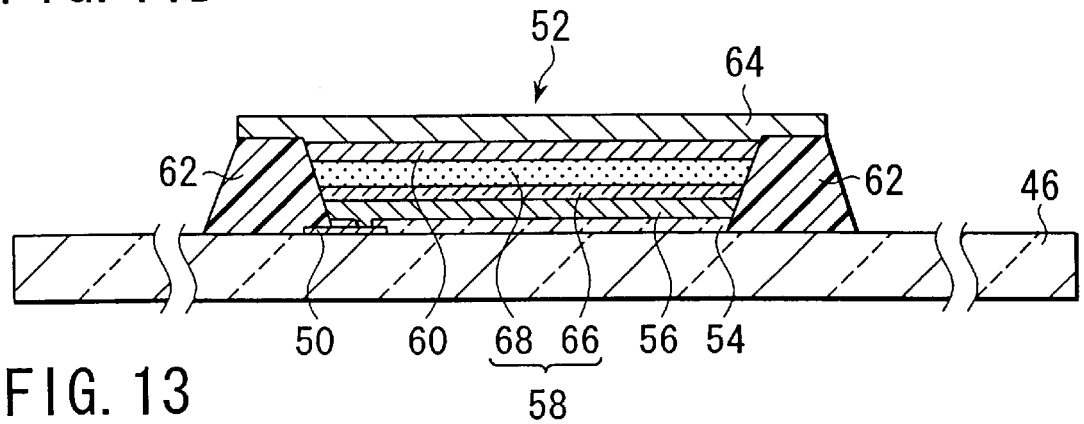

Finally, a cathode electrode 60 is formed on the organic EL layer 58, followed by forming a cover metal layer 64 on the cathode electrode 60, as shown in FIG. 13. In this case, the cathode electrode 60 is formed first by a vapor deposition of an elemental barium on the organic EL layer 58 within the vacuum chamber. Then, the cover metal layer 64 is formed on the cathode electrode 60 by vapor deposition of an elemental aluminum or an aluminum alloy, thereby finishing preparation of the array substrate 40 for the organic EL display device.

It should be noted that, in the array substrate 40 manufactured as above, the glass substrate 46 is thermally expanded or shrunk by about 5 to 20 ppm in the step of forming the TFT. In each of the steps of forming, for example, the light-emitting layers 68R,. 68G and 68B for each color, the entire array substrate 40 is collectively subjected to a vapor deposition treatment by using the large shadow mask 70, making it impossible to correct the pattern of the formed light-emitting layers in conformity with the amount of deformation of the glass substrate 46.

Such being the situation, according to the fourth embodiment of the present invention described above, the pattern for forming the semiconductor layer is shrunk or expanded in an amount corresponding to the thermal expansion or shrinkage of the glass substrate and is exposed to light in the first PEP included in the manufacturing process of the array substrate 40, i.e., in the PEP for converting the polycrystalline silicon layer into the semiconductor layer of the TFT 50, on the assumption that the glass substrate 40 is thermally expanded or shrunk by about 5 to 20 ppm. For example, where the glass substrate 40 is thermally expanded in the heat treating step, the pattern is diminished in advance by about 5 to 20 ppm, which corresponds to the amount of the thermal expansion, and, then, is subjected to the light exposure. In the photolithography step included in the subsequent PEP, the light exposure machine performs the light exposure of the next pattern while automatically aligning the next pattern with the previous pattern so as to perform a desired patterning. As a result, even if the glass substrate 40 is thermally expanded immediately before the step of the vapor deposition of each of the light-emitting layers 68R, 68G and 68B, the pattern formed in each of the previous steps is expanded together with the glass substrate so as to form the pattern conforming with the predetermined design value. Therefore, it is possible to form each of the light-emitting layers accurately in a predetermined light-emitting region even by the collective vapor deposition (collective process) using the shadow mask 70. It follows that it is possible to suppress the generation of an inconvenience such as the short circuiting between the anode electrode 56 and the cathode electrode 60 in each of the organic EL elements 52 so as to make it possible to manufacture the array substrate 46 of a high reliability with a high yield.

The array substrate 46 thus manufactured is arranged to face the counter substrate 42, and the peripheries of these substrates are bonded to each other, with the ultraviolet light curing type sealing material 43 interposed therebetween, under an inert gas atmosphere such as a nitrogen gas atmosphere or an argon gas atmosphere, as shown in FIG. 10. Then, the sealing material 43 is cured by irradiation with an ultraviolet light so as to manufacture an active matrix type organic EL display device having a large number of organic EL elements 52 arranged within the hermetic space 44.

In the fourth embodiment described above, the organic light-emitting layer was formed by a vapor deposition using a shadow mask. Alternatively, upon using macromolecular material as the light-emitting layer, it is also possible to form the light-emitting layer by the coating of the light-emitting material of each of R, G and B by using an ink jet process. In the ink jet process, the organic light-emitting layers of each color are collectively formed by using a plurality of ink jet heads which are arranged with fixed intervals. Even in this case, each organic light-emitting layer can be formed accurately in a predetermined position by performing the patterning in view of the deformation of the glass substrate in the patterning step before the collective processing step, even if the correction is not performed in the step of forming the organic light-emitting layer.

In the above-mentioned embodiments, the semiconductor layer of each TFT is formed of polycrystalline silicon, however, the present invention may be applied to an array substrate and display device wherein the semiconductor layer of each TFT is formed of amorphous silicon or single crystal silicon.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of manufacturing an array substrate including a plurality of first wiring layers and a plurality of second wiring layers formed on a substrate and a plurality of pixels connected to the first and second wiring layers via thin film transistors, wherein each of the thin film transistors includes a semiconductor layer formed of polycrystalline silicon and a gate electrode formed on the semiconductor layer with a gate insulating film interposed therebetween, the method comprising:

a first pattern forming step of forming a first pattern on the substrate by correcting in advance the size of the first pattern in view of an amount of deformation of the substrate; and a second pattern forming step of forming a second pattern on the substrate in conformity with the first pattern by a collective process.

2. The method of manufacturing an array substrate according to claim 1, which further comprises a plurality of pattern forming steps each including a film forming step for forming a film on the substrate and a patterning step for patterning the formed film, the first pattern forming step being the first pattern forming step included in the plurality of pattern forming steps.

3. The method of manufacturing an array substrate according to claim 1, wherein the first pattern forming step includes the step of forming a semiconductor layer on the substrate, and the step of patterning the formed semiconductor layer.

4. The method of manufacturing an array substrate according to claim 3, which further comprises a doping step of implanting a dopant into the semiconductor layer, a step of heat treating the substrate and the semiconductor layer so as to activate the dopant.

5. The method of manufacturing an array substrate according to claim 1, wherein the collective process in the second pattern forming step includes a light exposure process for collectively exposing the film formed on the substrate to light by using a mask.

6. The method of manufacturing an array substrate according to claim 5, wherein the second pattern forming step includes a process of forming a pattern including contact hole for connecting parts.

7. The method of manufacturing an array substrate according to claim 1, which further comprises the step of forming an electrode layer on the substrate, and the step of patterning the electrode layer so as to form a plurality of pixel electrodes each constituting a pixel.

8. The method of manufacturing an array substrate according to claim 1, wherein the collective process in the second pattern forming step includes a process of collectively forming a color filter layer.

9. The method of manufacturing an array substrate according to claim 1, wherein the color filter is formed by an ink jet process.

10. The method of manufacturing an array substrate according to claim 1, wherein the collective process in the second pattern forming step includes a light exposure by using a proximity method.

11. The method of manufacturing an array substrate according to claim 4, wherein the heat treating step is performed at a temperature of 75 to 90% of the substrate strain temperature.

12. A method of manufacturing a display device including a plurality of pixels arranged in a matrix manner, each of the pixels having a first electrode provided on a substrate, a second electrode opposing the first electrode, and a light modulating layer provided between the first and second electrodes, the method comprising:

a first pattern forming step of forming a first pattern on the substrate by correcting in advance the size of the first pattern in view of an amount of deformation of the substrate; and a second pattern forming step of forming a second pattern on the substrate in conformity with the first pattern by a collective process.

13. The method of manufacturing a display device according to claim 12, wherein each of the light modulating layers is formed of a liquid crystal layer.

14. The method of manufacturing a display device according to claim 12, wherein each of the light modulating layers is formed of an organic light-emitting layer.

15. The method of manufacturing a display device according to claim 14, wherein the collective process in the second pattern forming step includes of a process of collectively forming a plurality of light modulating layers each constituting the pixel on the insulating substrate by vapor deposition through a shadow mask.

16. The method of manufacturing a display device according to claim 15, wherein the second pattern forming step includes the step of collectively forming a plurality of light modulating layers by each color on the substrate by vapor deposition through the shadow mask.

17. The method of manufacturing a display device according to claim 14, wherein the collective process includes forming the light modulating layers by an ink jet process.

* * * * *